(12) United States Patent
Hongo et al.

(10) Patent No.: US 9,004,337 B2
(45) Date of Patent: Apr. 14, 2015

(54) SYSTEM AND METHOD FOR MANUFACTURING SEMICONDUCTOR DEVICE

(75) Inventors: Satoshi Hongo, Oita (JP); Kenji Takahashi, Ibaraki (JP); Kazumasa Tanida, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 13/479,968

(22) Filed: May 24, 2012

(65) Prior Publication Data

US 2013/0183810 A1    Jul. 18, 2013

(30) Foreign Application Priority Data

Jan. 18, 2012  (JP) ................................. 2012-008035

(51) Int. Cl.
- *B31B 1/68* (2006.01)
- *H01L 21/20* (2006.01)
- *H01L 21/67* (2006.01)
- *H01L 21/762* (2006.01)

(52) U.S. Cl.
CPC ...... *H01L 21/2007* (2013.01); *H01L 21/67092* (2013.01); *H01L 21/76251* (2013.01); *Y10T 29/413* (2013.01)

(58) Field of Classification Search
USPC .............................................. 227/19, 20, 22
See application file for complete search history.

(56) References Cited

U.S. PATENT DOCUMENTS

| | | | | |
|---|---|---|---|---|
| 7,479,441 | B2 * | 1/2009 | Kirk et al. | 438/455 |
| 2004/0055890 | A1 * | 3/2004 | Mizohata | 205/96 |
| 2005/0179887 | A1 * | 8/2005 | Suzawa et al. | 355/100 |
| 2011/0217795 | A1 | 9/2011 | Tanida et al. | |
| 2011/0304003 | A1 | 12/2011 | Tanida et al. | |
| 2011/0317050 | A1 | 12/2011 | Shirono et al. | |
| 2012/0049312 | A1 | 3/2012 | Tanida et al. | |

FOREIGN PATENT DOCUMENTS

| | | |
|---|---|---|
| JP | 7-6937 | 1/1995 |
| JP | 2003-224247 | 8/2003 |
| JP | 2004-95946 | 3/2004 |

OTHER PUBLICATIONS

U.S. Appl. No. 13/368,930, filed Feb. 8, 2012, Satoshi Hongo, et al.
U.S. Appl. No. 13/428,424, filed Mar. 23, 2012, Satoshi Hongo, et al.
Office Action issued Jan. 6, 2015 in Japanese Patent Application No. 2012-008035 with English translation.

* cited by examiner

*Primary Examiner* — Jae Lee
(74) *Attorney, Agent, or Firm* — Oblon, McClelland, Maier & Neustadt, L.L.P.

(57) ABSTRACT

According to one embodiment, a system for manufacturing a semiconductor device includes a spontaneous joining unit and a deformative joining unit. The spontaneous joining unit overlaps a first substrate and a second substrate and spontaneously joins mutual center portions of respective joint faces of the first substrate and the second substrate. The deformative joining unit deforms at least one peripheral portion of the respective joint faces of the first substrate and second substrate joined by the spontaneous joining unit toward the other peripheral portion and joins the mutual peripheral portions of the respective joint faces.

6 Claims, 6 Drawing Sheets

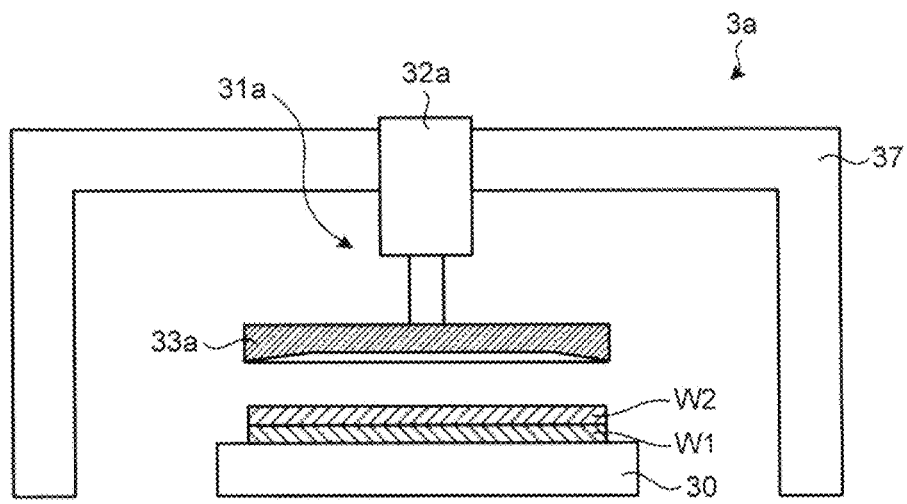
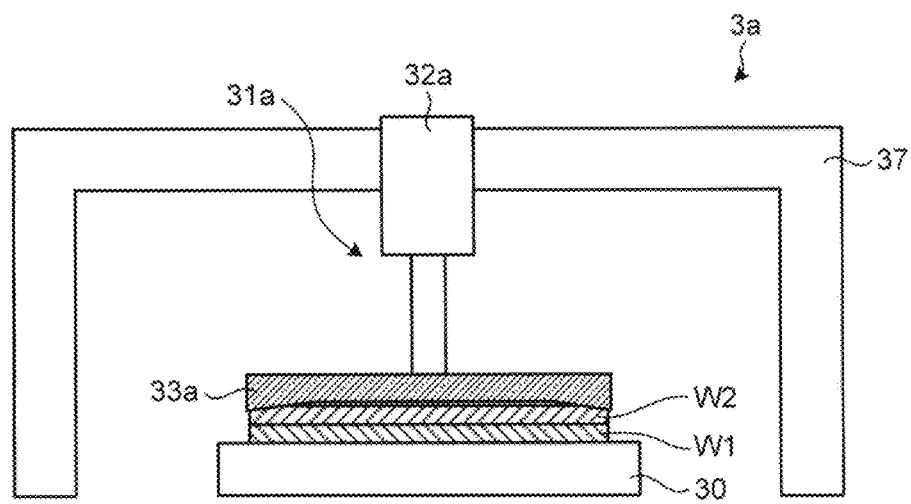

US 9,004,337 B2

SYSTEM AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2012-008035, filed on Jan. 18, 2012; the entire contents of which are incorporated herein by reference.

FIELD

Embodiments described herein relate generally to a system and a method for manufacturing a semiconductor device.

BACKGROUND

In a process for manufacturing a semiconductor device, there has been a case that a first substrate and a second substrate are joined. For example, in a case to manufacture a semiconductor device which includes a backside illumination type imaging element, a surface of the second substrate is joined to a surface of the first substrate at which a semiconductor element such as a photodiode is formed.

Subsequently, a light-receiving face is formed by grinding a back face of the first substrate to the vicinity of the photodiode having the second substrate as a support substrate, and then, an antireflection film, a color filter, a micro lens for collecting light and the like are sequentially formed at the light-receiving face. Thus, a semiconductor device which includes a backside illumination type imaging element is manufactured.

Here, the abovementioned first substrate is apt to be formed such that a peripheral portion is to be thinner than a center portion through the process to form the semiconductor element at the surface. Accordingly, when the surface of the second substrate is joined to the surface of the first substrate, a poor joint area occurs at the peripheral portions of joint faces. Since the semiconductor element formed at the poor joint area is subjected to edge-cutting, there has been a problem that a yield rate of the first substrate is decreased as a whole.

BRIEF DESCRIPTION OF THE DRAWINGS

FIGS. 6A and 6B are explanatory views illustrating an example of a deformative joining unit according to a modified example of the embodiment.

DETAILED DESCRIPTION

In general, according to one embodiment, a system for manufacturing a semiconductor device includes a spontaneous joining unit and a deformative joining unit. The spontaneous joining unit overlaps a first substrate and a second substrate and spontaneously joins mutual center portions of respective joint faces of the first substrate and the second substrate. The deformative joining unit deforms at least one peripheral portion of the respective joint faces of the first substrate and second substrate joined by the spontaneous joining unit toward the other peripheral portion and joins the mutual peripheral portions of the respective joint faces.

Exemplary embodiments of a system and a method for manufacturing a semiconductor device will be explained below in detail with reference to the accompanying drawings. The present invention is not limited to the following embodiments. Further, in the following, description is performed with an example of a manufacturing system and a manufacturing method to join a first substrate in which a semiconductor element such as a photodiode and a transistor for a backside illumination type solid-state imaging device, a wiring layer and the like are formed on an upper face of a semiconductor wafer and a second substrate which is to be a support substrate.

Figure 1A:
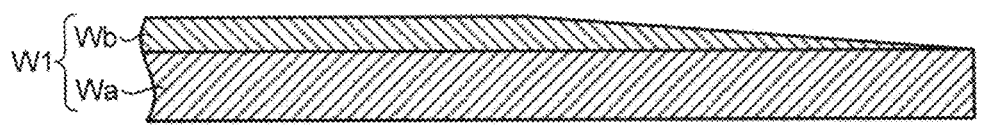
FIGS. 1A to 1C are explanatory views illustrating a method for manufacturing a semiconductor device according to an embodiment.
Figure 1B:
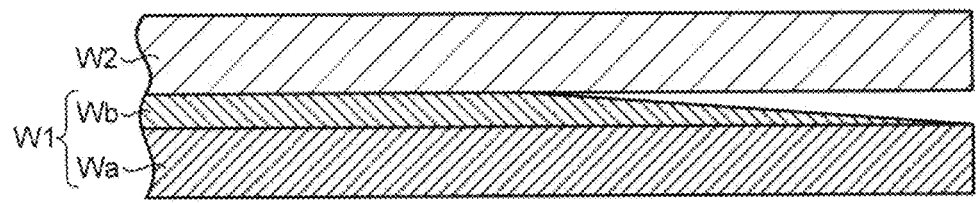
Figure 1C:
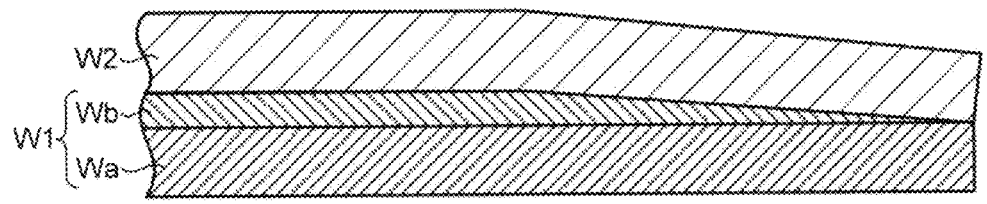

First, a method for manufacturing a semiconductor device according to an embodiment will be explained with reference to FIGS. 1A to 1C. FIGS. 1A to 1C are explanatory views illustrating a method for manufacturing a semiconductor device according to the embodiment. As illustrated in FIG. 1A, in the manufacturing method according to the embodiment, a first substrate (hereinafter, described as the first substrate W1) having an element formative layer Wb formed on an upper face of a semiconductor wafer Wa is prepared.

Here, the semiconductor wafer Wa is a silicon wafer, for example. Further, the element formative layer Wb is a layer to which a photodiode and a transistor for a backside illumination type solid-state imaging device, a wiring layer and the like are previously formed, for example. Here, an insulation film which subsequently becomes to a joint face with a second substrate (hereinafter, described as the second substrate W2; see FIG. 1B) is formed at the uppermost face of the element formative layer Wb.

Here, a method for forming the element formative layer Wb is briefly explained. First, the semiconductor wafer Wa is prepared and processes called Front End of Line (FEOL) such as a photolithography process, a film-formation process, an etching process and an ion-implantation process are repeated against an active layer at a surface of the semiconductor wafer Wa. Thus, the semiconductor element such as a photodiode and a transistor is formed at the active layer of the semiconductor wafer Wa.

Then, a wiring layer is formed by performing a process called Back End of Line (BEOL). In such BEOL, an upper-layer wiring layer is formed of aluminum (Al) after a multi-layer wiring layer having a damascene structure is formed of copper (Cu), for example.

Next, the element formative layer Wb is formed, for example, by forming the insulation film at an upper face of the upper-layer wiring layer with chemical vapor deposition (CVD) and subsequently flattening a surface of the insulation film with chemical mechanical polishing (CMP) or reactive ion etching (RIE).

Since the uppermost face of the multi-layer wiring layer is flattened when forming the damascene structure, it is not necessarily required to flatten the surface of the insulation film at the uppermost layer once again in a case that the insulation film is formed directly at the upper face of the multi-layer wiring layer without forming the upper-layer wiring layer on the multi-layer wiring layer having the damascene structure. Here, the insulation film to be formed at the uppermost layer of the element formative layer Wb is an oxide film, a film of silicon oxide (SiO2) formed of tetraethoxysilane (TEOS), a film of semiconductor of which dielectric constant is relatively low (Low-k), a film of silicon nitride (SiN), or the like.

The element formative layer Wb is apt to be formed such that a peripheral portion is to be thinner than a center portion through the process to form the semiconductor element. For example, with the abovementioned CVD, polishing quantity at a peripheral portion is apt to be larger than that at a center portion of the element formative layer Wb. Further, in the process to form the wiring layer with Cu plating, film thickness of plating at a peripheral portion is apt to be thinner than that at a center portion of the element formative layer Wb.

In this manner, there is a case that the element formative layer Wb is formed such that a peripheral portion is thinner than a center portion through the process to form the semiconductor element. As a result, the first substrate W1 is formed to have a shape that a peripheral portion is thinner than a center portion.

In a manufacturing method according to the embodiment, the second substrate W2 (see FIG. 1B) is joined to the upper face of the first substrate W1 which has a shape that the peripheral portion is thinner than the center portion as described above. Here, when the first substrate W1 and the second substrate W2 are simply joined, a poor joint area occurs at the peripheral portions of the first substrate W1 and the second substrate W2 owing to that the peripheral portion of the first substrate W1 is thinner than the center portion thereof. Since the poor joint area is subsequently subjected to edge-cutting, a yield rate of the first substrate W1 is decreased as a whole.

Accordingly, in the manufacturing method according to the embodiment, joining of the first substrate W1 and the second substrate W2 is performed with a two-step joining process as described in the following. For example, the second substrate W2 of which diameter is approximately the same as the first substrate W1 is prepared as illustrated in FIG. 1B.

Then, in the manufacturing method according to the embodiment, the mutual center portions of the first substrate W1 and the second substrate W2 are spontaneously joined prior to the peripheral portions thereof as overlapping the first substrate W1 and the second substrate W2 after positions of the first substrate W1 and the second substrate W2 are matched. Details of procedure to spontaneously join the mutual center portions will be described later with reference to FIGS. 3A to 3C and FIGS. 4A and 4B.

Subsequently, in the manufacturing method according to the embodiment, the mutual peripheral portions of the first substrate W1 and the second substrate W2 are mandatorily joined while the peripheral portion of the second substrate W2 is deformed toward the peripheral portion of the first substrate W1, as illustrated in FIG. 1C. Details of procedure to join the mutual peripheral portions will be explained later with reference to FIGS. 5A to 5C.

Accordingly, with the manufacturing method according to the embodiment, since occurrence of a poor joint area at the peripheral portions of the first substrate W1 and the second substrate W2 can be suppressed, a yield rate of the first substrate W1 can be improved as a whole as reducing area to be subjected to edge-cutting.

Subsequently, not being illustrated in the drawings, in the manufacturing method according to the embodiment, a light-receiving face of a backside illumination type solid-state imaging device is formed as thinning the first substrate W1 by grinding a lower face (a back face) of the first substrate W1 in a state of being supported as the second substrate W2 being the support substrate.

Subsequently, an external leading electrode of the backside illumination type solid-state imaging device is formed at the back face side of the first substrate W1, and then, an antireflection film, a color filter, a micro lens and the like are sequentially formed at the light-receiving face. Then, the first substrate W1 and the second substrate W2 are dices into chip units along previously-defined dicing lines. Lastly, protection glass attaching, resin encapsulating and the like are performed after each diced chip is mounted on a ceramic package or the like and electrical connection is performed with wire bonding or the like. Thus, the backside illumination type solid-state imaging device is completed.

Figure 2:
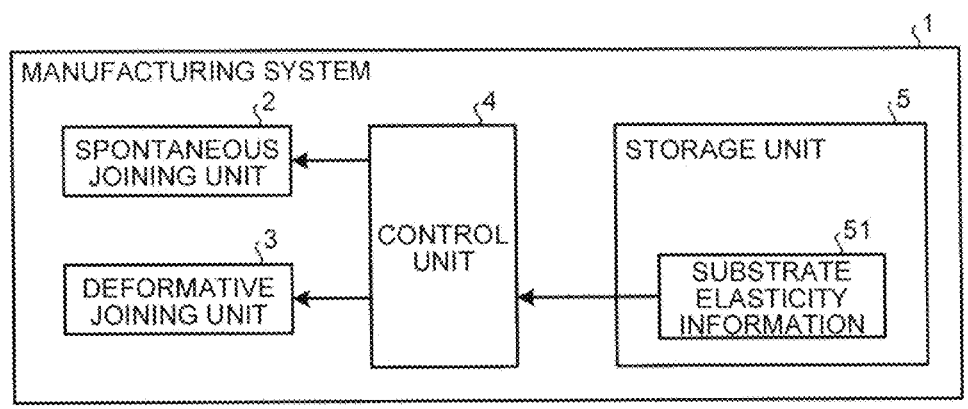
FIG. 2 is an explanatory view illustrating an example of a structure of a manufacturing system according to the embodiment.

Next, a structure of a manufacturing system 1 according to the embodiment will be explained with reference to FIG. 2. FIG. 2 is an explanatory view illustrating an example of the structure of the manufacturing system 1 according to the embodiment. As illustrated in FIG. 2, the manufacturing system 1 includes a spontaneous joining unit 2, a deformative joining unit 3, a control unit 4, and a storage unit 5. Here, the storage unit 5 stores substrate elasticity information 51.

The spontaneous joining unit 2 is a processing unit which spontaneously joins the mutual center portions of the first substrate W1 and the second substrate W2 (see FIG. 1B) as being operated under control of the control unit 4. A specific example of a structure and operation of the spontaneous joining unit 2 will be described later with reference to FIGS. 3A to 3C and FIGS. 4A and 4B.

The deformative joining unit 3 is a processing unit which joins the mutual peripheral portions of the first substrate W1 and the second substrate W2 while deforming the peripheral portion of the second substrate W2 toward the peripheral portion of the first substrate W1 out of the first substrate W1 and second substrate W2 having the mutually-joined center portions as being operated under control of the control unit 4. A specific example of a structure and operation of the deformative joining unit 3 will be described later with reference to FIGS. 5A to 5C.

Here, in the example illustrated in FIG. 2, the spontaneous joining unit 2 and the deformative joining unit 3 are illustrated as separate processing units. However, it is also possible to structure the spontaneous joining unit 2 and the deformative joining unit 3 as a single processing unit. In such a case, a manufacturing device is structured with the processing unit which includes the spontaneous joining unit 2 and the deformative joining unit 3, the control unit 4, and the storage unit 5.

The control unit 4 is a processing unit which totally controls operation of the entire manufacturing system 1. The control unit 4 controls operation of the spontaneous joining unit 2 by outputting a specific operational command to the spontaneous joining unit 2. Further, the control unit 4 controls operation of the deformative joining unit 3 by outputting a specific operational command to the deformative joining unit 3 based on the substrate elasticity information 51 stored in the storage unit 5.

Here, the substrate elasticity information 51 is information indicating elasticity anisotropy of the second substrate W2 of which peripheral portion is to be deformed by the deformative joining unit 3. For example, in a case that the second substrate W2 is a silicon substrate, the elasticity of the second substrate W2 is uneven within the peripheral portion depending on crystal orientation of silicon which structures the substrate.

In such a case, the storage unit 5 stores information regarding elasticity of divided areas as the substrate elasticity information 51 for the respective divided areas obtained by dividing the peripheral portion of the second substrate W2 in the circumferential direction into a plurality of areas. Then, the control unit 4 performs positioning so that the crystal orientation of the second substrate W2 is oriented to a predetermined direction and outputs the operational command to join the mutual center portions of the first substrate W1 and the second substrate W2 to the spontaneous joining unit 2. Further, the control unit 4 outputs the operational command to deform the entire peripheral portion of the second substrate W2 evenly toward the peripheral portion of the first substrate W1 to the deformative joining unit 3.

Figure 3A:
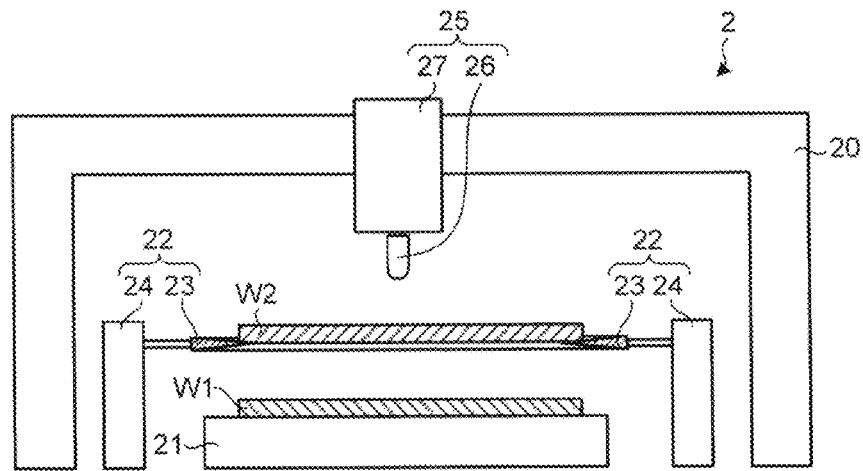
FIGS. 3A to 3C are explanatory side views illustrating an example of a spontaneous joining unit according to the embodiment.
Figure 3B:
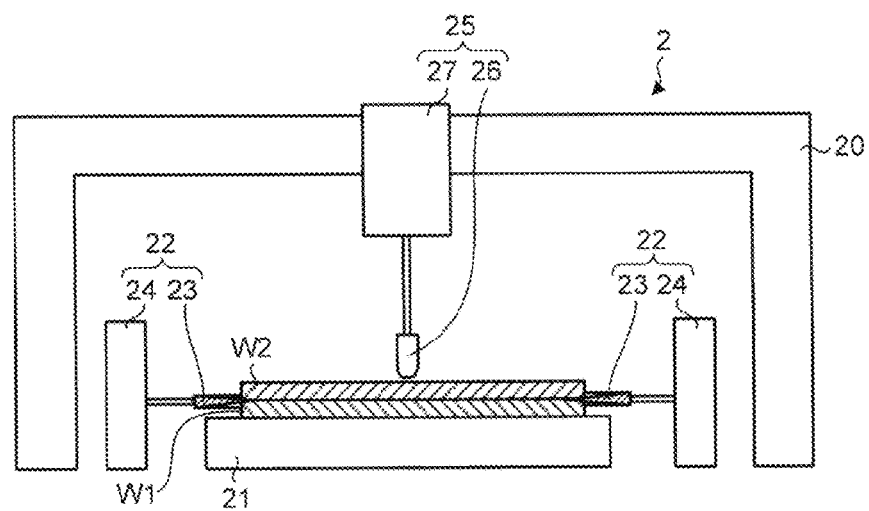
Figure 3C:
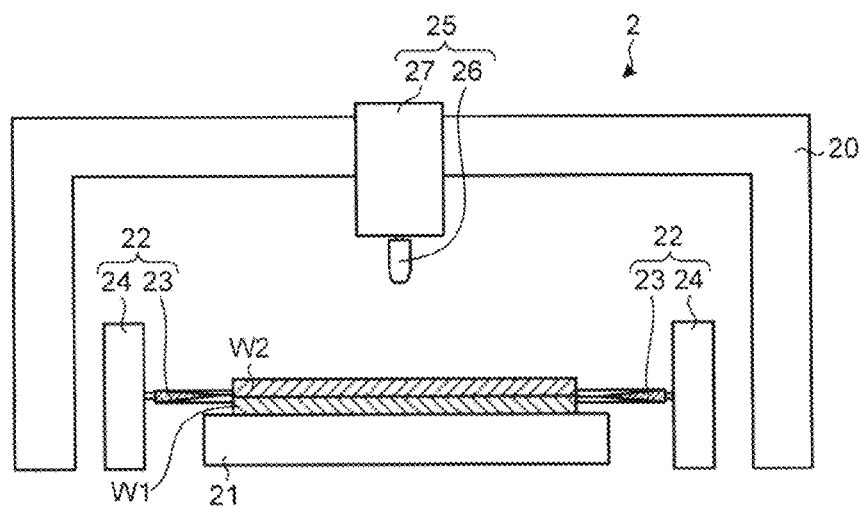

Next, an example of a structure and operation of the spontaneous joining unit 2 will be explained with reference to FIGS. 3A to 3C and FIGS. 4A and 4B. FIGS. 3A to 3C are explanatory side views illustrating the example of the spontaneous joining unit 2 according to the embodiment.

Figure 4A:
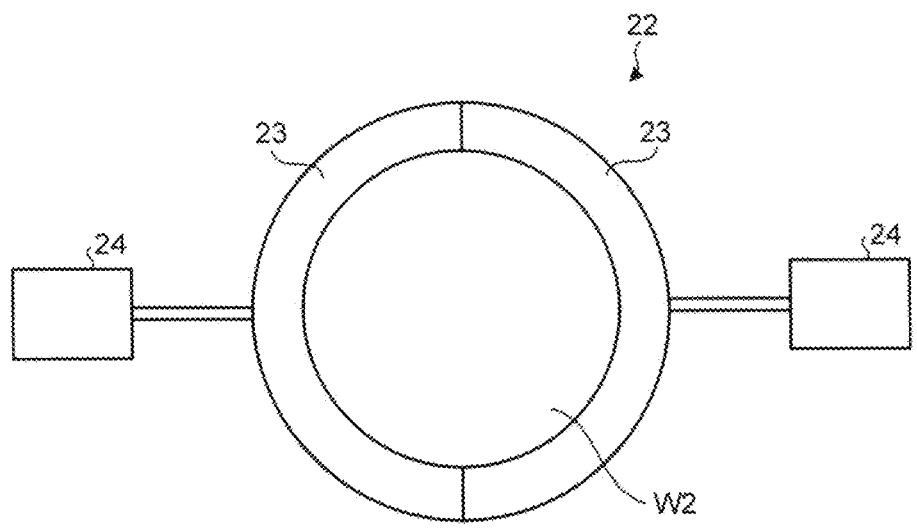
FIGS. 4A and 4B are explanatory plane views of a substrate elevating portion according to the embodiment.
Figure 4B:
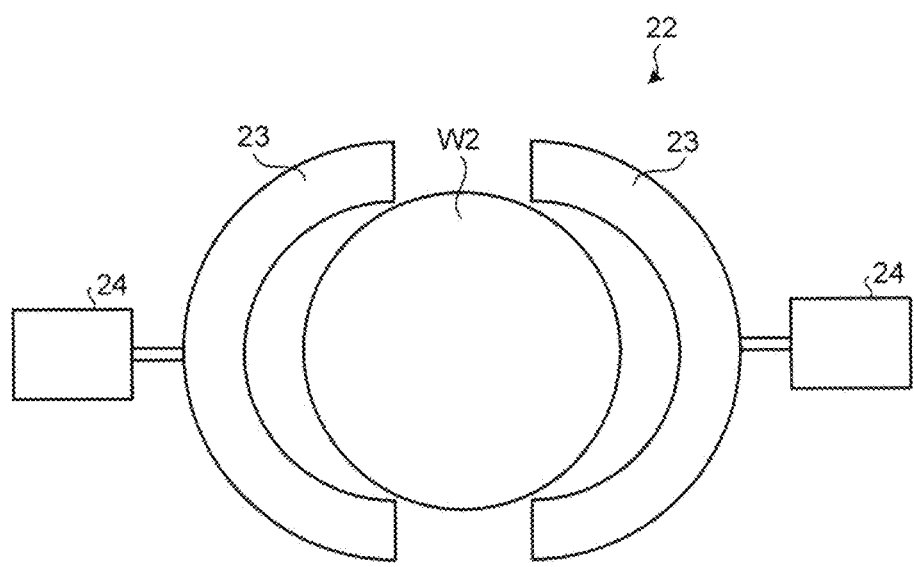

Further, FIGS. 4A and 4B are explanatory plane views of a substrate elevating portion 22 according to the embodiment. Here, FIGS. 3A to 3C illustrate the first substrate W1, the second substrate W2, and a later-mentioned spacer 23 selectively with sectional schematic views to facilitate understanding.

As illustrated in FIG. 3A, the spontaneous joining unit 2 includes a stage 21, the substrate elevating portion 22, and a center pressing portion 25. The stage 21 holds the first substrate W1 which is placed in a state that the element formative layer Wb is at the upper side. The stage 21 is formed of abrasion-resistant resin which prevents damaging to the substrate, such as polyether ether ketone (PEEK), for example, and holds the first substrate W1 with sticking by sucking air from a space between the upper face and the placed first substrate W1.

The substrate elevating portion 22 includes the spacer 23 and a spacer drive portion 24. The spacer drive portion 24 has an elevating function to lift and lower the spacer 23 as illustrated in FIGS. 3A and 3B and a shifting function to advance and retreat the spacer 23 as illustrated in FIGS. 4A and 4B.

The spacer 23 is shaped to divide a circular thin plate member into two parts in a diameter direction as illustrated in FIG. 4A and is formed of abrasion-resistant resin which prevents damaging to the substrate, such as PEEK, for example. In a state of being advanced, the spacer 23 becomes to a circular thin plate member of which inner diameter is smaller than the outer diameter of the second substrate W2 and of which outer diameter is larger than the outer diameter of the second substrate W2. Accordingly, in a state of being lifted and advanced, the spacer 23 is in a state that the second substrate W2 can be placed thereon.

On the other hand, in a state of being retreated, the spacer 23 is in a state that the second substrate W2 cannot be placed thereon, as illustrated in FIG. 4B. Here, the spacer 23 is formed so that the section becomes thinner from the outer circumference toward the inner circumference, as illustrated in FIG. 3A.

The center pressing portion 25 is arranged as being opposed to the stage 21 in a state of being supported by a support beam 20 above the spacer 23. The center pressing portion 25 includes a pressing bit drive portion 27 and a pressing bit 26 which is driven to be lifted and lowered by the pressing bit drive portion 27. The pressing bit 26 is formed of abrasion-resistant resin which prevents damaging to the substrate, such as PEEK, for example.

Here, not being illustrated in the drawings, the spontaneous joining unit 2 includes a first substrate conveying mechanism which conveys and places the first substrate W1 onto the stage 21 and a second substrate conveying mechanism which conveys and places the second substrate W2 onto the spacer 23 in a lifted and advanced state.

Next, an example of the operation of the spontaneous joining unit 2 is explained. As illustrated in FIG. 3A, in the spontaneous joining unit 2, the first substrate W1 is conveyed and placed onto the stage 21. The conveying and placing of the first substrate W1 are performed by the first substrate conveying mechanism. As that time, the first substrate W1 is placed on the stage 21 in a state that the element formative layer Wb is at the upper side. The stage 21 holds the placed first substrate W1.

Subsequently, as illustrated in FIGS. 3A and 4A, the second substrate W2 is conveyed and placed onto the spacer 23 in a lifted and advanced state. The conveying and placing of the second substrate W2 are performed by the second substrate conveying mechanism. At that time, the second substrate conveying mechanism performs the placing while adjusting the placing direction of the second substrate W2 so that the crystal orientation is oriented to the predetermined direction.

Here, the first substrate W1 to be placed on the stage 21 and the second substrate W2 to be placed on the spacer 23 are to be placed in a state that mutual joint faces are cleaned. For cleaning the joint faces, metallic contamination on the surfaces is eliminated with alkaline or acidic cleaning solution, for example. Further, organic substances on the surfaces are eliminated with ozone (O3) treatment. Further, when dust is stuck to the joint faces, it is also possible to eliminate the dust with megasonic cleaning or two-fluid cleaning. Here, the spontaneous joining unit 2 may be structured so that such cleaning is performed at the inside thereof.

Further, the first substrate W1 to be placed on the state 21 and the second substrate W2 to be placed on the spacer 23 are to be placed in a state that the mutual joint faces are activated. For activating the joint faces, the activation process is performed on the joint faces with plasma treatment such as ion-beam, ion-gun and RIE, for example. At that time, the activating is performed in atmospheric gas which prevents damaging to the joint faces, such as argon (Ar), nitrogen (N2), oxygen (O2), hydrogen (H2) and mixed gas thereof, for example.

Then, after the cleaning of the activated joint faces is performed, the first substrate W1 is placed on the stage 21 and the second substrate W2 is placed on the spacer 23. In the cleaning of the above, dust which is stuck during the activation treatment is eliminated with a cleaning method which prevents damaging to the activated joint faces, such as two-fluid cleaning, megasonic cleaning and water cleaning, for example. Here, the spontaneous joining unit 2 may be structured so that the activation treatment and the cleaning after the activation treatment are performed at the inside thereof.

Next, in the spontaneous joining unit 2, the spacer 23 is lowered by the spacer drive portion 24, so that the first substrate W1 and the second substrate W2 are overlapped as illustrated in FIG. 3B. At that time, the spacer 23 is interposed between the peripheral portions of the first substrate W1 and the second substrate W2. However, the peripheral portion of the first substrate W1 is thinner than the center portion, the center portions of the first substrate W1 and the second substrate W2 are to be in an approximately contacted state. Accordingly, the joint faces of the center portions are mutually closed so that the distance therebetween becomes several angstroms.

Subsequently, in the spontaneous joining unit 2, the pressing bit 26 is lowered by the pressing bit drive portion 27 and the center of the second substrate W2 is pressed by the pressing bit 26. Accordingly, at the center portions of the joint faces, dangling bonds of both of the activated joint faces start to be joined via water (H2O) on the molecular level. Such joining is concentrically expanded from the center of the joint faces and is advanced gradually toward the peripheral portions.

Then, in the spontaneous joining unit 2, the spacer 23 is retreated by the spacer drive portion 24 as illustrated in FIGS. 3C and 4B. Accordingly, the joining between the first substrate W1 and the second substrate W2 is advanced to positions where the first substrate W1 is thinner than the center portion thereof. Subsequently, the pressing bit 26 is lifted by the pressing bit drive portion 27. Accordingly, the first substrate W1 and the second substrate W2 mutually joined at the center portions are in a state of being ejectable from the spontaneous joining unit 2.

Figure 5A:
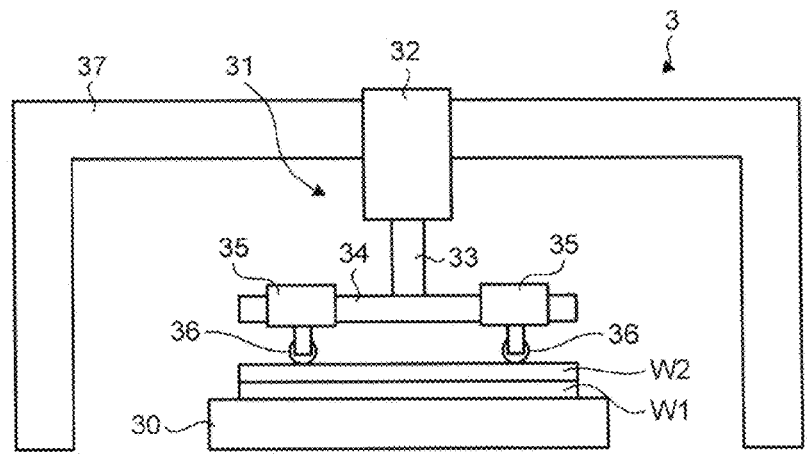
FIGS. 5A to 5C are explanatory side views illustrating an example of a deformative joining unit according to the embodiment.
Figure 5B:
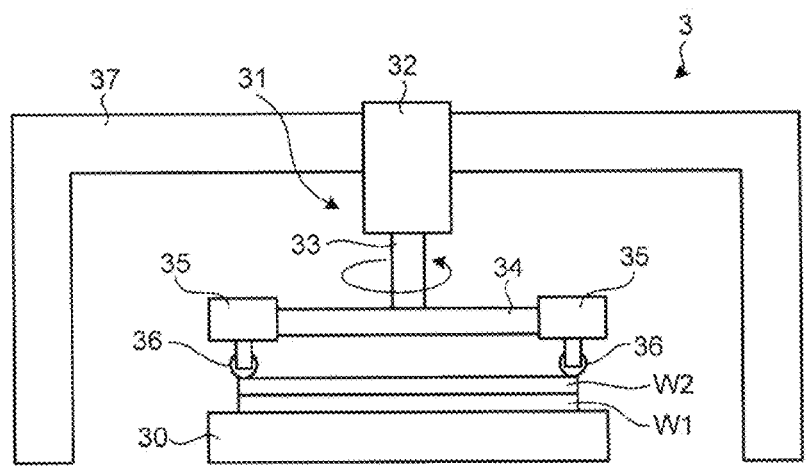
Figure 5C:
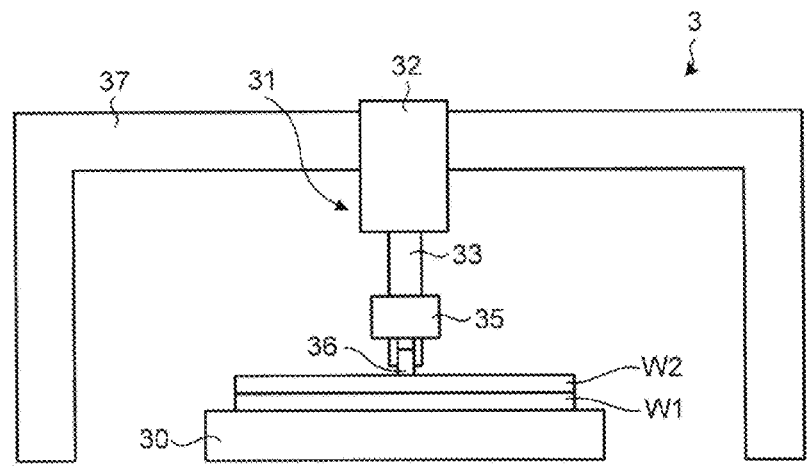

Next, an example of a structure and operation of the deformative joining unit 3 will be explained with reference to FIGS. 5A to 5C. FIGS. 5A to 5C are explanatory side views illustrating the example of the deformative joining unit 3 according to the embodiment. As illustrated in FIG. 5A, the deformative joining unit 3 includes a stage 30 and a periphery pressing portion 31.

The stage 30 is formed of abrasion-resistant resin which prevents damaging to the substrate, such as PEEK, for example, and holds the joined first substrate W1 and second substrate W2 placed in a state that the second substrate W2 is at the upper side. The stage 30 holds the first substrate W1 and the second substrate W2 in a joined state with sticking by sucking air from a space between the upper face and the placed first substrate W1.

The periphery pressing portion 31 is arranged as being opposed to the stage 30 in a state of being supported by a support beam 37. The periphery pressing portion 31 includes a rotation drive portion 32, a rotary shaft 33, a rail 34, a pressing force adjusting portion 35, and a pressing bit 36. The pressing bit 36 is formed of abrasion-resistant resin which prevents damaging to the substrate, such as PEEK, for example.

The rotation drive portion 32 rotationally drives the rotary shaft 33 as being attached to the support beam 37. The rotary shaft 33 is connected to the rotation drive portion 32 at the base end and is provided with the rail at the top end. The rail 34 is attached to the top end of the rotary shaft 33 in a posture that the longitudinal direction is in parallel to an upper face of the stage 30.

Further, two pressing force adjusting portions 35 are slidably attached to the rail 34. Each pressing force adjusting portion 35 adjusts the pressing force of the rotatable roller-shaped pressing bit 36 under control of the control unit 4. Here, not being illustrated in the drawings, the deformative joining unit 3 includes a joined substrate conveying mechanism which conveys and places the first substrate W1 and the second substrate in the joined state onto the stage 30.

Next, an example of the operation of the deformative joining unit 3 is explained. As illustrated in FIG. 5A, in the deformative joining unit 3, the first substrate W1 and the second substrate W2 in the joined state are conveyed and placed onto the stage 30. The conveying and placing of the first substrate W1 and the second substrate W2 are performed by the joined substrate conveying mechanism.

At that time, the first substrate W1 and the second substrate W2 in the joined state are placed on the stage 30 in a state that the second substrate W2 is at the upper side. The stage 30 holds the first substrate W1 and the second substrate W2 with sticking to the lower face of the placed first substrate W1.

Subsequently, in the deformative joining unit 3, the pressing force adjusting portion 35 starts pressing with the pressing bit 36 against the peripheral portion of the second substrate W2 from the center portion side of the second substrate W2. Then, as illustrated in FIG. 5B, the pressing with the pressing bit 36 against the second substrate W2 is continued until the pressing bit 36 arrives at the outer circumference of the second substrate W2 while the pressing force adjusting portion 35 is moved along the rail 34.

Subsequently, as illustrated in FIGS. 5B and 5C, in the deformative joining unit 3, the abovementioned pressing with the pressing bit 36 against the second substrate W2 is repeated while the rotary shaft 33 is rotated by the rotation drive portion 32 by predetermined angles (for example, 10 degrees). Thus, the round peripheral portion of the second substrate W2 is pressed. Here, FIG. 5C illustrates a state that the rotary shaft 33 is rotated by 90 degrees from a state illustrated in FIGS. 5A and 5B.

In this manner, the deformative joining unit 3 can join the mutual peripheral portions of the first substrate W1 and the second substrate W2 by deforming the peripheral portion of the second substrate W2 toward the peripheral portion of the first substrate W1.

Here, it is also possible that the pressing force adjusting portion 35 repeatedly press the peripheral portion of the upper face of the second substrate W2 with the pressing bit 36 while being moved above the peripheral portion of the second substrate W2 along the rail 34 in a reciprocated manner. Accordingly, the deformative joining unit 3 can join the mutual peripheral portions of the first substrate W1 and the second substrate W2 more firmly.

Further, the deformative joining unit 3 deforms the round (entire) peripheral portion of the second substrate W2 evenly toward the peripheral portion of the first substrate W1 by adjusting pressing force with the pressing bit 36 in accordance with a pressing position of the second substrate W2 under control of the control unit 4. Accordingly, the deformative joining unit 3 can evenly join the entire peripheral portions of the first substrate W1 and the second substrate W2.

In the abovementioned embodiment, explanation is performed on a case that the second substrate W2 has anisotropy in elasticity depending on crystal orientation. However, when the second substrate W2 without having elasticity anisotropy is used, the structure of the deformative joining unit 3 can be changed to have a simpler structure.

In the following, explanation is performed on a deformative joining unit 3a in a case of using the second substrate W2 without having elasticity anisotropy with reference to FIGS. 6A and 6B. FIGS. 6A and 6B are explanatory views illustrating an example of the deformative joining unit 3a according to a modified example of the embodiment.

Here, in FIGS. 6A and 6B, the same numeral is given to the same structural element as that illustrated in FIGS. 5A to 5C. Further, FIGS. 6A and 6B illustrate the first substrate W1, the second substrate W2, and a pressing bit 33a selectively with sectional schematic views to facilitate understanding.

As illustrated in FIG. 6A, the deformative joining unit 3a includes the stage 30 and a periphery pressing portion 31a. The periphery pressing portion 31a is arranged as being opposed to the stage 30 in a state of being supported by the support beam 37. The periphery pressing portion 31a includes a pressing drive portion 32a and a pressing bit 33a. The pressing bit 33a is formed of abrasion-resistant resin which prevents damaging to the substrate, such as PEEK, for example.

The pressing drive portion 32a drives the pressing bit 33a in an elevating manner. The pressing bit 33a of the deformative joining unit 3a is a disc-shaped member of which bottom face is dome-shaped as being upwardly convex and of which diameter is approximately the same as the second substrate W2.

In the deformative joining unit 3a, when the first substrate W1 and the second substrate W2 are held as being located on the stage 30 in a state that the second substrate W2 is at the upper side, the pressing drive portion 32a lowers the pressing bit 33a and presses the upper face of the second substrate W2 with the pressing bit 33a.

At that time, since the bottom face of the pressing bit 33a is formed into a dome-like shape as being upwardly convex as described above, a peripheral portion of the bottom face is contacted to the peripheral portion of the upper face of the second substrate W2 while a center portion of the bottom face is not contacted to the center portion of the upper face of the second substrate W2.

Accordingly, in the deformative joining portion 3a, the peripheral portion of the upper face of the second substrate W2 is selectively pressed by the peripheral portion of the bottom face of the pressing bit 33a, so that the peripheral portion of the second substrate W2 can be deformed toward the peripheral portion of the first substrate W1. Therefore, the mutual peripheral portions of the first substrate W1 and the second substrate W2 can be joined in the deformative joining unit 3a.

Thus, when the second substrate W2 without having elasticity anisotropy is used, the deformative joining portion 3a only having a simple structure including the pressing bit 33a which is capable of being driven in an elevating manner can join the mutual peripheral portions of the first substrate W1 and the second substrate W2 only by lowering the pressing bit 33a.

As described above, in the manufacturing system 1, the mutual center portions of the first substrate W1 and the second substrate W2 are spontaneously joined by the spontaneous joining unit 2. Further, in the manufacturing system 1, the peripheral portion of the second substrate W2 is deformed toward the peripheral portion of the first substrate W1 by the deformative unit 3, so that the mutual peripheral portions of the first substrate W1 and the second substrate W2 are joined.

With the above, according to the manufacturing system 1, even if the peripheral portion of the first substrate W1 becomes thinner than the center portion through the process to form the element formative layer Wb, for example, it is possible to suppress occurrence of a poor joint area at the peripheral portions of the joint faces when the first substrate W1 and the second substrate W2 are jointed. Therefore, according to the manufacturing system 1, a yield rate of the first substrate W1 can be increased as a whole.

Further, the deformative joining unit 3 performs annealing treatment on the first substrate W1 and the second substrate W2 in the joined state after the joining between the first substrate W1 and the second substrate W2 is completed. Here, the deformative joining unit 3 performs the annealing treatment for several hours between 200° C. and 1000° C. (preferably, approximately at 400° C.), for example.

Accordingly, water (H2O) on the molecular level joined with dangling bonds at the joint faces is evaporated or taken into the insulation film at the joint faces, so that joint force between the first substrate W1 and the second substrate W2 can be further strengthened. Here, in a case that sufficient joint strength is obtained even if annealing treatment is not performed, the annealing treatment can be skipped.

In the above embodiments, the peripheral portion of the second substrate W2 is deformed toward the peripheral portion of the first substrate W1 as being pressed by the deformative joining unit 3, 3a. However, it is also possible to deform the peripheral portion of the second substrate W2 with a method other than pressing.

For example, in the manufacturing system 1, it is possible to arrange a deformative joining unit which generates deformation by heating the peripheral portions at the joint faces of the first substrate W1 and the second substrate W2. The deformative joining unit heats the joined first substrate W1 and second substrate W2 in a state that the second substrate W2 is at the upper side.

Accordingly, the peripheral portion of the second substrate W2 which is softened with heating is deformed toward the peripheral portion of the first substrate W1 with gravity. In this manner, since the mutual peripheral portions of the first substrate W1 and the second substrate W2 can be joined, a yield rate of the first substrate W1 can be increased as a whole by heating the joined first substrate W1 and second substrate W2 as well.

Further, in a case that the first substrate W1 and the second substrate W2 are joined by deforming the second substrate W2 with heating, the joint force between the first substrate W1 and the second substrate W2 can be further strengthened as being similar to the abovementioned annealing treatment.

Here, in the deformative joining unit which deforms the second substrate W2 with heating, heat quantity of the heating is to be adjusted depending on a position of the peripheral portion of the second substrate W2 in a case that strength against heat varies in accordance with a position of the peripheral portion of the second substrate W2 to be deformed. In such a case, the deformative joining unit selectively heats the peripheral portion of the second substrate W2 by irradiating plasma to the peripheral portion of the second substrate W2, for example.

In a case that heat-resistance varies in accordance with a position of the peripheral portion of the second substrate W2, the deformative joining unit evenly deforms the entire peripheral portion of the second substrate W2 by adjusting the irradiation strength of plasma depending on a plasma-irradiating position of the peripheral portion of the second substrate W2.

When the above structure is adopted, the storage unit 5 stores substrate heat-resistance information in which positions of the peripheral portion of the second substrate W2 are associated with the heat-resistance at the respective positions of the second substrate W2, and then, the control unit 4 adjusts the irradiation strength of plasma based on the substrate heat-resistance information.

Further, in the abovementioned embodiments, the peripheral portion of the second substrate W2 is deformed. However, in the manufacturing system 1, it is also possible that the first substrate W1 and the second substrate W2 in the joined state are placed on the stage 30 as the first substrate W1 being at the upper side and that the peripheral portion of the first substrate W1 is deformed toward the peripheral portion of the second substrate W2. With the above, the mutual peripheral portions of the first substrate W1 and the second substrate W2 can be joined as well.

Further, the structures of the stages 21, 30 are examples and can be variously modified. For example, in addition to the function of substrate sticking, the stages 21, 30 may have a function of substrate heating. With this structure, joint force of the joint faces can be rapidly strengthened by performing the heating process right after the first substrate W1 and the second substrate W2 are joined. Here, when the heating function is provided to the stages 21, 30, porous stages formed of ceramic material such as Al2O3, for example, are adopted as the stages 21, 30.

Further, in a case that the sticking function is provided to the stages 21, 30, for example, the stages 21, are arranged by forming holes for sticking to resin material such as acrylic, inorganic material such as quartz, Si and SiC, or metallic material such as Al on which alumite treatment is performed.

Further, the structure of the spacer 23 described in the embodiments is an example and can be modified variously. For example, the spacer 23 may be formed of metallic material. Further, the spacer 23 may have a pole shape, a cone shape, or a flat plate shape. Furthermore, the spacer 23 may have a structure to support the peripheral portion of the second substrate W2 at a plurality of points.

Further, means to support the second substrate W2 is not limited to the spacer 23. For example, it is also possible that a support member to support the second substrate W2 as sucking the upper face thereof is disposed instead of the spacer 23 to support the second substrate W2 by the support member.

Further, the structures of the pressing bits 26, 36, 33*a* are examples and can be modified variously. For example, the pressing bits 26, 36, 33*a* may be pin-shaped to press the upper face of the second substrate W2 with point contact or may be plate-shaped to press the upper face of the second substrate W2 with surface contact.

Further, it is also possible to arrange a drive mechanism capable of pressing the upper face of the second substrate W2 by moving any one of the pressing bits 26, 36, 33*a* to an arbitral position above the second substrate W2. With this structure, it is possible to press the peripheral portion of the upper face of the second substrate W2 as changing the pressing position to the peripheral portion after the center portion of the upper face of the second substrate W2 is pressed with any one of the pressing bits 26, 36, 33*a*. Accordingly, since the spontaneous joining unit 2 and the deformative joining unit 3 can be structured as a single processing unit, the processing space can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A system for manufacturing a semiconductor device, comprising:
    a spontaneous joining unit which overlaps a first substrate and a second substrate and which spontaneously joins mutual center portions of respective joint faces of the first substrate and the second substrate; and
    a deformative joining unit which deforms at least one peripheral portion of the respective joint faces of the first substrate and second substrate joined by the spontaneous joining unit toward the other peripheral portion and which joins the mutual peripheral portions of the respective joint faces,
    wherein the deformative joining unit includes a pressing bit to press a round peripheral portion of the first substrate or second substrate to be deformed while moving on the peripheral portion in a radial direction of the substrate in a reciprocated manner.

2. The system for manufacturing a semiconductor device according to claim 1,
    wherein the deformative joining unit presses and deforms the peripheral portion of the joint face.

3. The system for manufacturing a semiconductor device according to claim 2,
    wherein the deformative joining unit adjusts pressing force to deform the peripheral portion in accordance with elasticity anisotropy of the substrate to be deformed.

4. The system for manufacturing a semiconductor device according to claim 1,
    wherein the deformative joining unit heats and deforms the peripheral portion of the joint face.

5. The system for manufacturing a semiconductor device according to claim 1,
    wherein the spontaneous joining unit spontaneously joins the first substrate to which a backside illumination type solid-state imaging element is formed at a side of one face to be the joint face and the second substrate which becomes to a support substrate when the other face of the first substrate is to be ground; and
    the deformative joining unit deforms the peripheral portion of the second substrate toward the peripheral portion of the first substrate.

6. The system for manufacturing a semiconductor device according to claim 1,
    wherein the spontaneous joining unit includes a pressing bit to press the center portion of the overlapped first substrate or second substrate.

* * * * *